US008536898B2

(12) United States Patent
Rennie et al.

(10) Patent No.: US 8,536,898 B2
(45) Date of Patent: Sep. 17, 2013

(54) SRAM SENSE AMPLIFIER

(76) Inventors: David James Rennie, Etobicoke (CA); Manoj Sachdev, Waterloo (CA)

( * ) Notice: Subject to any disclaimer, the term of this patent is extended or adjusted under 35 U.S.C. 154(b) by 103 days.

(21) Appl. No.: 13/151,276

(22) Filed: Jun. 2, 2011

(65) Prior Publication Data

US 2011/0298496 A1 Dec. 8, 2011

Related U.S. Application Data (60) Provisional application No. 61/350,862, filed on Jun. 2, 2010.

(51) Int. Cl.
*G01R 19/00* (2006.01)
(52) U.S. Cl.
USPC .................................. 327/51; 327/55; 327/57
(58) Field of Classification Search
USPC ...................................................... 327/51–57
See application file for complete search history.

(56) References Cited

U.S. PATENT DOCUMENTS

| | | | |
|---|---|---|---|
| 5,508,644 A * | 4/1996 | Branson et al. ................. | 327/57 |
| 5,534,800 A | 7/1996 | Hiraki | |
| 5,550,777 A * | 8/1996 | Tran ............................... | 365/205 |
| 5,627,789 A | 5/1997 | Kalb | |
| 5,834,953 A | 11/1998 | Glass | |
| 5,939,903 A * | 8/1999 | Lin ................................. | 327/57 |
| 6,184,722 B1 | 2/2001 | Hayakawa | |
| 6,483,353 B2 * | 11/2002 | Kim et al. ....................... | 327/55 |
| 7,313,040 B2 | 12/2007 | Huang | |
| 7,545,180 B2 * | 6/2009 | Goel et al. ...................... | 327/57 |

* cited by examiner

*Primary Examiner* — Hai L Nguyen (57) ABSTRACT

A sense amplifier for use in a memory array having a plurality of memory cells is provided. The sense amplifier provides low power dissipation, rapid sensing and high yield sensing operation. The inputs to the sense amplifier are the differential bitlines of an SRAM column, which are coupled to the sense amplifier via the sources of two PMOS transistors. A CMOS latching element comprised of two NMOS transistors and the aforementioned PMOS transistors act to amplify any difference between the differential bitline voltages and resolve the output nodes of the sense amplifier to a full swing value. The latching element is gated with two additional PMOS transistors which act to block the latching operation until the sense amplifier is enabled. One or more equalization transistors ensure the latch remains in the metastable state until it is enabled. Once the latch has resolved it consumes no DC power, aside from leakage.

6 Claims, 13 Drawing Sheets

SRAM SENSE AMPLIFIER

BACKGROUND OF THE INVENTION

1. Field of the Invention

The present invention relates generally to the field of sense amplifiers which are used to sense differential voltages and amplify them to full swing, thus identifying the data value contained in the selected memory cell. This application claims the benefit of priority of U.S. Provisional Patent Application No. 61/350,862 filed Jun. 2, 2010 which is incorporated herein by reference in its entirety.

2. Prior Art

Embedded memories are a vital building block in integrated circuits. Static Random Access Memory (SRAM) arrays are a preferred method of implementing embedded memories owing to higher speed, robust design, and ease of integration. In a modern system-on-a-chip (SOC), SRAM arrays may occupy more than half of the die area and are very important in terms of area, yield, reliability and power consumption. As such, there is great motivation to improve the performance of SRAM arrays.

Referring to

Figure 1:
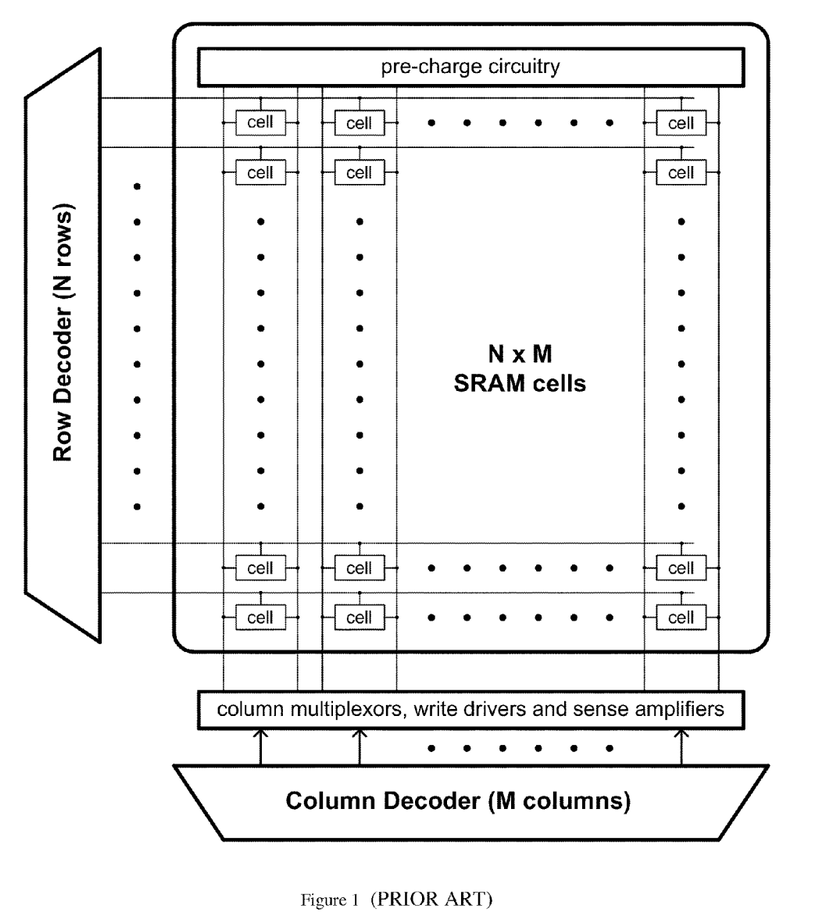
FIG. 1 is a block diagram of an embedded memory

FIG. 1, the architecture of an SRAM array is broadly described. In an SRAM array a plurality of memory cells are connected to a plurality of bit lines. In FIG. 1 the array shown has N rows and M columns, and therefore N×M memory cells. Each memory cell is connected to one of a plurality of word lines (WL), which are arranged in a direction perpendicular to the bit lines. Only one word line is active at a time. A row decoder takes in address information and decodes this in order to activate a single row by enabling that rows wordline signal. Similarly the column decoder takes in address information and activates the necessary columns. The number of columns activated depends on the size of the word in the context of the system. For example, the system may have a 32 bit word, and in that case 32 columns would be activated as a time. Sense amplifiers are used during a read operation to take the differential signals on the bit lines and output full swing data which represents the value of the data stored in the selected SRAM cell. Each column may comprise a sense amplifier, or column multiplexors can be used to multiplexing the bit lines in the columns into a single set of sense amplifiers, thereby reducing the required number of sense amplifiers. The column decoder also sends information to the write circuitry, which is used to write data into a selected SRAM cells during a write operation.

Referring to

Figure 2:
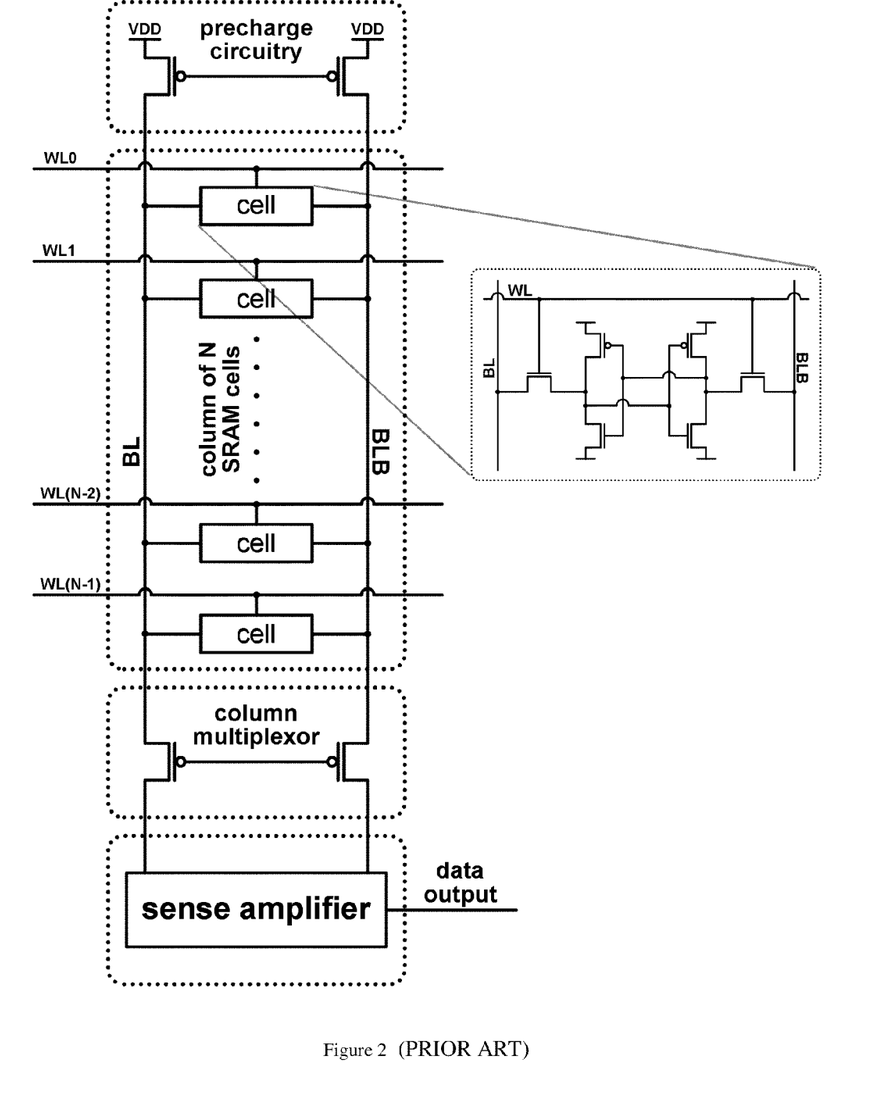
FIG. 2 is a block diagram of a single column in an SRAM array

FIG. 2, the architecture of a single column is described in more detail. A column may comprise precharge circuitry, a plurality of SRAM cells, a plurality of word lines (WL), differential bit lines (BL and BLB), a column multiplexor and a sense amplifier. The circuitry for the write operation is neglected, as it does not relate to the invention. When the SRAM array is not active (i.e. no read or write operation) the precharge circuitry is enabled, thus keeping the voltages on the bitline high. When a read operation is taking place the precharge circuitry is disabled and a single wordline signal is enabled. When the wordline signal is enabled, a single SRAM cell is able to affect the voltage on the bit lines. The circuitry of the most common SRAM cell, the 6T cell, is illustrated in FIG. 2. An SRAM cell comprises a latch where one side stores a high logical value, and the other side stores a low logical value. When the access transistors of the SRAM cell are enabled by the wordline signal (WL) the SRAM cell affects the bit lines by discharging one of the bit lines, BL or BLB, depending on which side of the latch stores the low logical value. An SRAM cell is designed to be as small as possible in order that the largest number of memory cells, and therefore information, can be contained in a given area. As the SRAM cell is small, its transistors are intrinsically weak. The bit lines must span the entire height of the column and are connected to each SRAM cell in the column. As such the bit lines have a high intrinsic parasitic capacitive load. The result of the weak SRAM cell and the large capacitance of the bit lines is that is takes a long time for the SRAM cell to fully discharge. Moreover, once discharged the bit line must be re-charged by the pre-charge circuitry, which results in a non-trivial power dissipation. The purpose of the sense amplifier is to detect a small differential signal on the bit lines and amplify it in order to identify the data value stored in the selected SRAM cell.

Referring to

Figure 3:
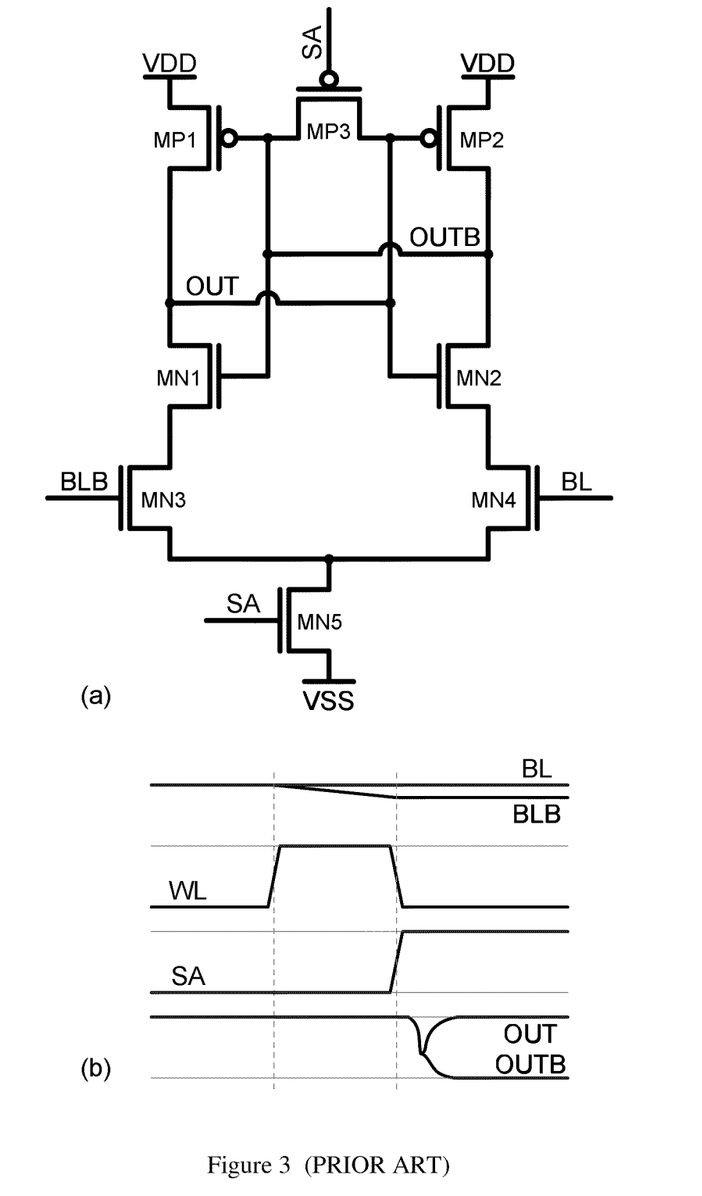
FIG. 3(a) is a circuit diagram of a conventional voltage mode sense amplifier
FIG. 3(b) a diagram showing voltage waveforms which illustrate the operation of the sense amplifier shown in FIG. 3(a).

FIG. 3(a), the schematic of a voltage mode sense amplifier is shown, and

FIG. 3(b) shows waveforms which illustrate its operation. The read operation begins with the wordline signal WL being enabled. This results in a differential voltage being generated on the bit lines. The sense amplifier is enabled via the control signal SA. In this sense amplifier the bit lines are connected to the gates of two NMOS transistors, MN3 and MN4 and as such the voltages on the bit lines BL and BLB control the effective resistance of these NMOS transistors. Before the sense amplifier is enabled the control signal SA is low, and therefore the latch comprising MN1, MN2, MP1, and MP2 is equalized by way of transistor MP3. This means that the voltages on nodes OUT and OUTB are the same and are in this case are assumed to be equal to VDD. When the sense amplifier is enabled the equalization transistor MP3 is disabled and a path to ground is activated by way of transistor NMOS MN5. However the impedance of the path from node OUT to VSS will be different than the path from node OUTB to VSS, based on the voltages BLB and BL. Referring to FIG. 3(b), in this case the voltage on bitline BLB is slightly lower than the voltage on bitline BL, and as such the resistance from OUT to VSS will be higher than the resistance from OUTB to VSS. This means that node OUTB will begin discharging faster than node OUT, and due to the regenerative action of the latch this difference will be amplified to full swing, with the voltage on node OUT resolving to VDD and the voltage on node OUTB resolving to VSS.

Referring to

Figure 4:
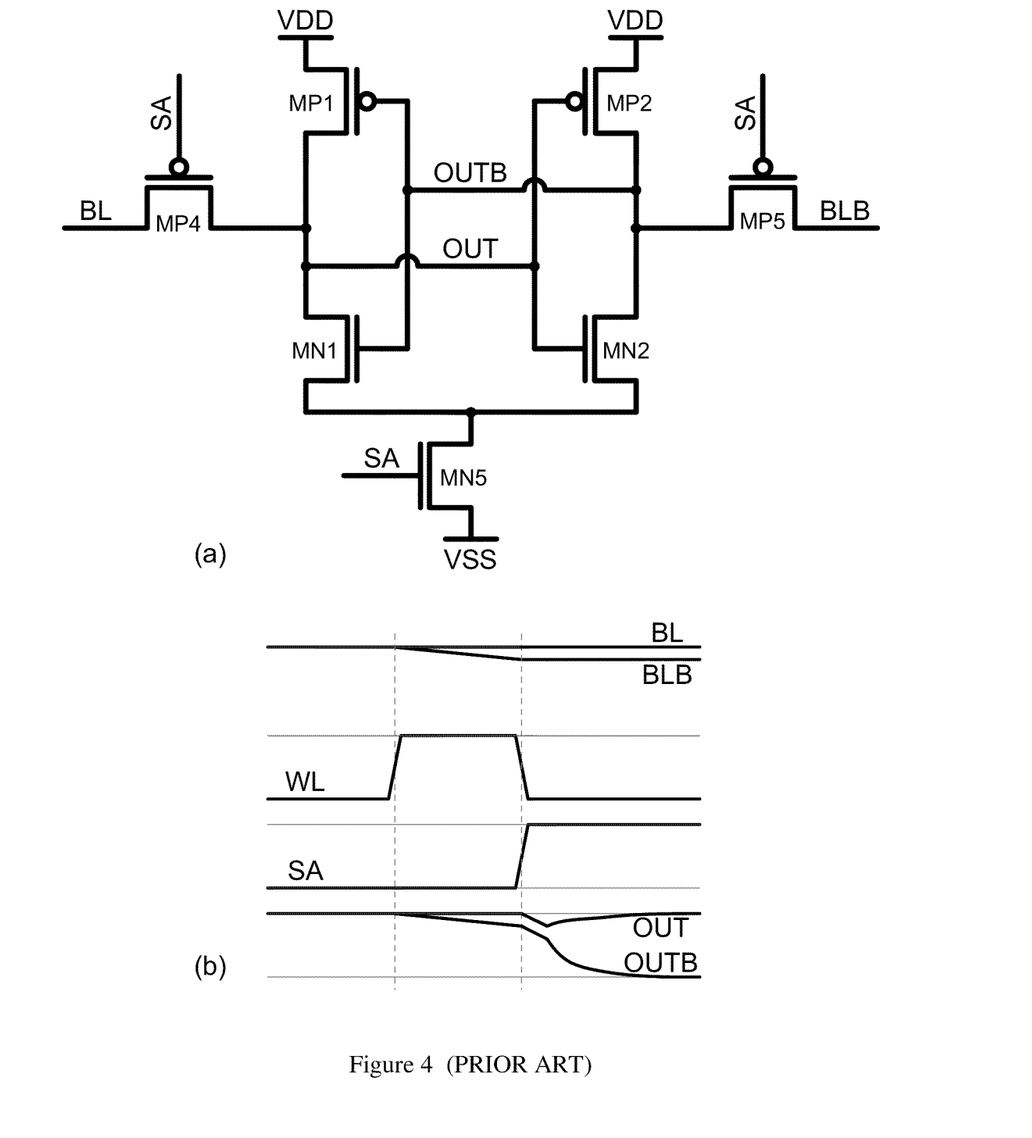
FIG. 4(a) is a circuit diagram of a conventional current mode sense amplifier
FIG. 4(b) a diagram showing voltage waveforms which illustrate the operation of the sense amplifier shown in FIG. 4(a).

FIG. 4(a), the schematic of a current mode sense amplifier is shown, and

FIG. 4(b) shows waveforms which illustrate its operation. The read operation begins with the wordline signal WL being enabled. This results in a differential voltage being generated on the bit lines. The sense amplifier is enabled via the control signal SA. In this sense amplifier the bit lines are connected to the drains of two PMOS transistors. MP4 and MP5. The sources of transistors MP4 and MP5 are in turn connected to nodes OUT and OUTB. Before the sense amplifier is enabled the control signal SA is low, and therefore the latch comprising MN1, MN2, MP1, and MP2 has no path to VSS. Before the sense amplifier is enabled transistors MP4 and MP5 couple the voltage on the bitlines BL and BLB into the nodes OUT and OUTB. When the sense amplifier is enabled a path to ground is activated by way of NMOS transistor MN5. When the sense amplifier is enabled the transistors MP4 and MP5 are disabled, decoupling the internal nodes of the sense amplifier OUT and OUTB from the bitlines BL and BLB. While the bitlines are decoupled from the internal nodes of the sense amplifier the last voltage on the bitlines before the sense amplifier is enabled becomes the initial condition for the latch, and should define the way in which the sense amplifier will resolve. Referring to FIG. 4(b), in this case the voltage on bitline BLB is slightly lower than the voltage on bitline BL, and as such when the sense amplifier is enabled the voltage on node OUT is slightly higher than the voltage on node OUTB. Due to the regenerative action of the latch this difference will be amplified to full swing, with the voltage on node OUT resolving to VDD and the voltage on node OUTB resolving to VSS.

Referring to

FIG. 5(a), the schematic of a conventional sense amplifier is shown, and

Figure 5:
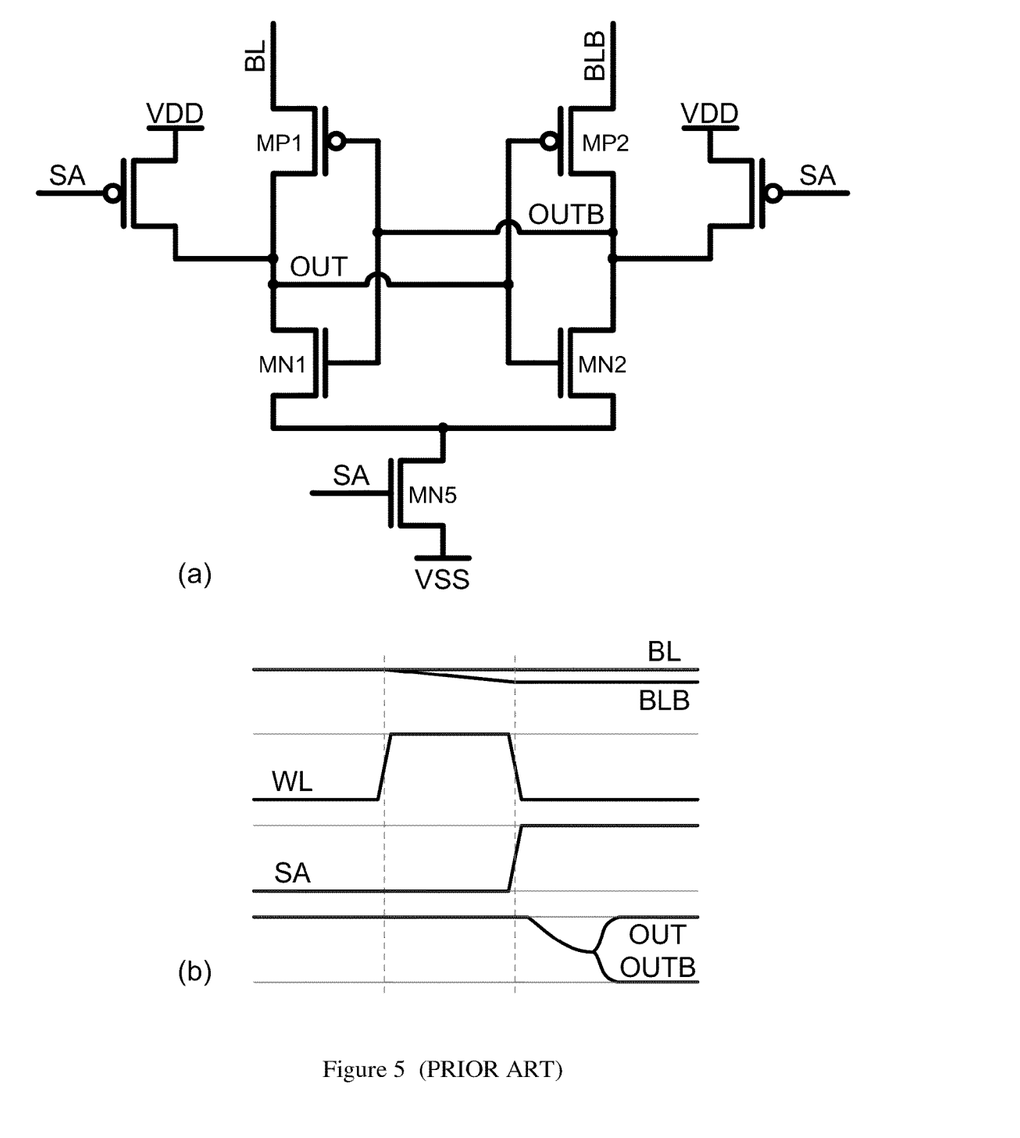
FIG. 5(a) is a circuit diagram of a sense amplifier where the sources of the PMOS transistors are connected to the bitlines
FIG. 5(b) is a diagram showing voltage waveforms which illustrate the operation of the sense amplifier shown in FIG. 5(a).

FIG. 5 (b) shows waveforms which illustrate its operation. The read operation begins with the wordline signal WL being enabled. This results in a differential voltage being generated on the bit lines. The sense amplifier is enabled via the control signal SA. In this sense amplifier the bit lines are coupled to the sense amplifier through the sources of two PMOS transistors, MP1 and MP2. The drains of the transistors MP1 and MP2 are in turn connected to nodes OUT and OUTB. Before the sense amplifier is enabled the control signal SA is low, and therefore the latch comprising the set of transistors MN1, MN2, MP1, and MP2 is equalized by way of transistors MP3 and MP4. This means that at the instant the sense amplifier is enabled the voltages on nodes OUT and OUTB are the same and are in this case are assumed to be equal to the supply voltage VDD. When the sense amplifier is enabled the equalization transistor MP3 is disabled and a path to ground is activated by way of NMOS transistor MN5. Once the path to ground is activated the latch comprising the set of transistors MN1, MN2, MP1, and MP2 begins to resolve. Ideally the resolution of the sense amplifier will be determined by the differential bitline voltage, however for this sense amplifier the bitlines are coupled through transistors MP1 and MP2, which are disabled due to the voltage at their gates being initially set to the high level VDD. The voltage OUT and OUTB will begin to discharge and will eventually reduce to a level low-enough that the transistors MP1 and MP2 are turned on, and this allows the differential bitline voltages to have an effect on the resolution of the latch. However, until this happens the resolution of the latch will be determined by any transistor mismatch between transistors MN1 and MN2. In modern technologies mismatch can be very large, and as such this sense amplifier suffers from poor yield.

CMOS technologies continue to scale to smaller geometries. This allows for greater performance and density, however it brings with it an increase in the variability of the process. In earlier generations of CMOS processes variability was primarily systematic, however as feature sizes scale below 100 nm, random variability has become increasingly problematic. Systematic variability causes circuits to vary from die to die or wafer to wafer, while random variability can cause variations in the properties of even transistors which are adjacent to one another. Sense amplifiers are affected by process variability, and the most significant effect is the creation of a voltage offset. A voltage offset in a sense amplifier means that the circuit is inclined to resolve in a particular direction. This can often result in an incorrect decision. For example, if a sense amplifier has an offset voltage of 50 mV and the differential voltage on the bit lines is only 40 mV, the decision the sense amplifier makes is due the its offset voltage, not due to the differential voltage on the bit lines. The differential voltage on the bit lines must be larger than the offset voltage of the sense amplifier in order for the sense amplifier to correctly resolve.

The effect of variability is related to yield, performance and power. All circuits which comprise an embedded memory are negatively affected by variability. For example, variability will result in SRAM bit cells which are weaker, and in turn can generate less differential voltage on the bit lines. As previously described variability can affect a sense amplifier by creating offset voltages which make it more inclined to make incorrect decisions. If an SRAM array cannot correctly identify the information contained in the SRAM cell then it is not able to function as an embedded memory, and as such this reduces the yield of the SoC. In order to combat the effects of variability the length of time the word line is activated can be increased. This will allow more time for the SRAM cell to generate a differential voltage on the bit lines and thus the input voltage to the sense amplifier will be larger. However, this has a negative impact on the timing performance of the embedded memory, and as such on the timing performance of the SOC. Moreover, for those SRAM cells which function correctly the longer wordline signal will result in increased power dissipation. In order to combat the effects of variability the transistor sizes can also be increased, however this leads to a less are efficient design, which increases cost and is highly undesirable.

Referring to

Figure 6:
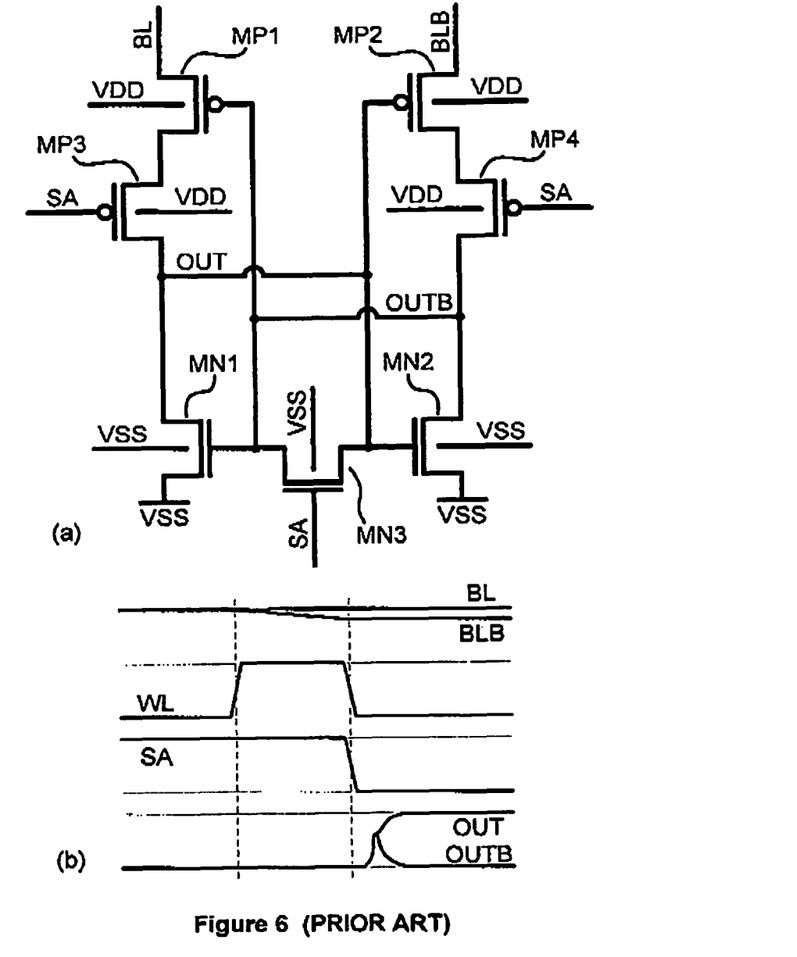
FIG. 6(a) is a circuit diagram of a sense amplifier where the bitlines are connected to the sources of the PMOS transistors in the latching element, and the gating transistors are between the NMOS and PMOS transistors in the latching element.
FIG. 6(b) is a diagram showing voltage waveforms which illustrate the operation of the sense amplifier shown in FIG. 6(a).

FIG. 6(a), the schematic of a conventional sense amplifier is shown, and

FIG. 6(b) shows waveforms which illustrate its operation. The read operation begins with the wordline signal WL being enabled. This results in a differential voltage being generated on the bit lines. The sense amplifier is enabled via the control signal SA. In this sense amplifier the bit lines are coupled to the sense amplifier through the sources of two PMOS transistors, MP1 and MP2. The drains of the transistors MP1 and MP2 are in turn connected to nodes OUT and OUTB. Before the sense amplifier is enabled the control signal SA is low, and therefore the latch comprising the set of transistors MN1, MN2, MP1, and MP2 is equalized by way of transistor MN3. This means that at the instant the sense amplifier is enabled the voltages on nodes OUT and OUTB are the same. When the sense amplifier is enabled the equalization transistor MN3 is disabled. The latch comprising MN1, MN2, MP1, and MP2 is gated by transistors MP3 and MP4, which means that while MP3 and MP4 are disabled the latch cannot resolve, but rather stays in a metastable state. Once the control signal SA is set to enable the latch comprising the set of transistors MN1, MN2, MP1, and MP2 begins to resolve. Ideally the resolution of the sense amplifier will be determined by the differential bitline voltage.

Referring to

Figure 10:
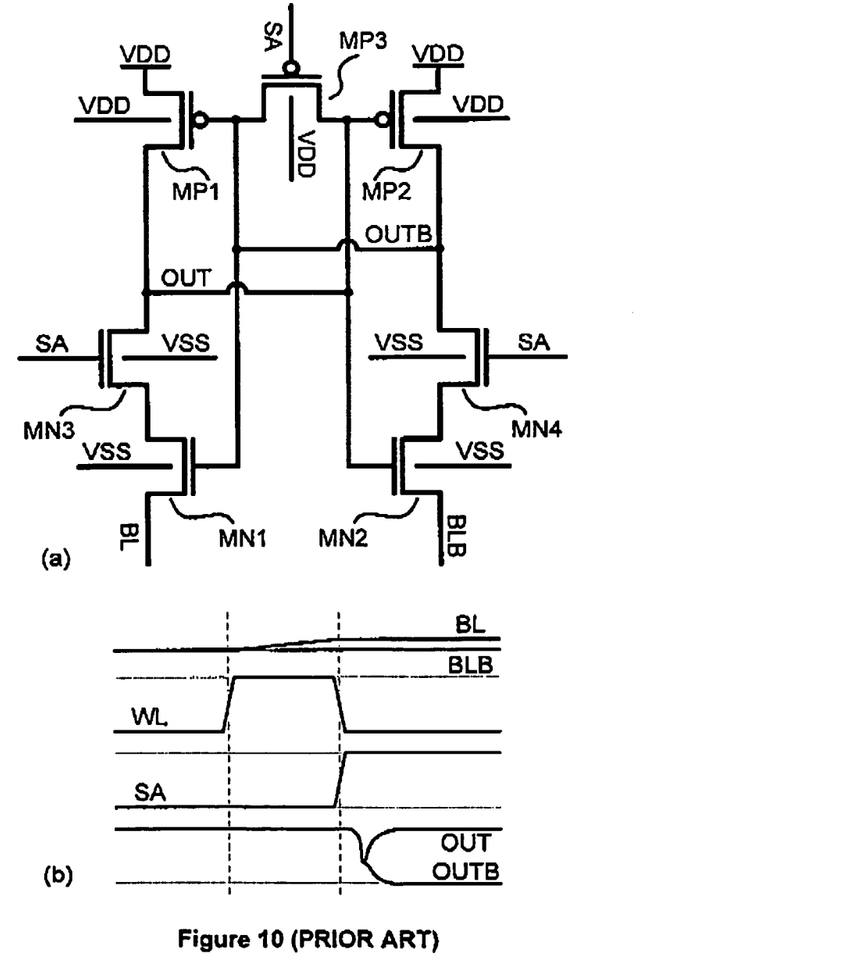

FIG. 10(a), the schematic of a conventional sense amplifier is shown. The sense amplifier in FIG. 10(a) is similar to the sense amplifier in FIG. 6(a), however the inputs are into the drains of NMOS transistors rather than PMOS transistors, and the gating transistors are also NMOS, rather than PMOS transistors.

Referring to

FIG. 10(b) shows waveforms which illustrate the operation of the sense amplifier in FIG. 10(a).

SUMMARY OF THE INVENTION

A new sense amplifier is introduced. The sense amplifier provides for high-speed and low-power sensing. The sense amplifier also shows improved yield behaviour, correctly making decisions even when the differential input voltage is very low. The sense amplifier comprises four transistors (two N-type transistors and two P-type transistors) which form a dual-inverter latching element. The differential input signal (i.e. the bitlines) are coupled into the sense amplifier on the sources of two of the transistors in the latching element (either the N-type transistors or the P-type transistors). The differential input signal (i.e. the bitlines) are also coupled into the sense amplifier on the secondary control inputs (e.g. the bulk node of a MOS transistor) of at leas two of the transistors in the sense amplifier. The sense amplifier comprises two additional gating transistors and one or more pre-charging transistors. Before the sense amplifier is enabled the latching transistors are gated by way of these two gating transistors and the latch is kept in a metastable state by way of the pre-charging transistors. When the sense amplifier is activated the pre-charging transistors are disabled, the gating transistors are enabled and the output nodes of the sense amplifier resolve to full swing values based on the value of the differential input signal.

In accordance with an aspect of the present invention there is provided a . . .

BRIEF DESCRIPTION OF THE DRAWINGS

An embodiment of the present invention will now be described by way of example only with reference to the following drawings in which:

FIG. 10(a) is a circuit diagram of a sense amplifier where the bitlines are connected to the sources of the NMOS transistors in the latching element, and the gating transistors are between the NMOS and PMOS transistors in the latching element.

FIG. 10(b) is a diagram showing voltage waveforms which illustrate the operation of the sense amplifier shown in FIG. 10a.

DETAILED DESCRIPTION OF THE PREFERRED EMBODIMENTS

For convenience, like structures in drawings will be referenced by like numerals in the description. The following describes a sense amplifier.

Referring to

Figure 7:
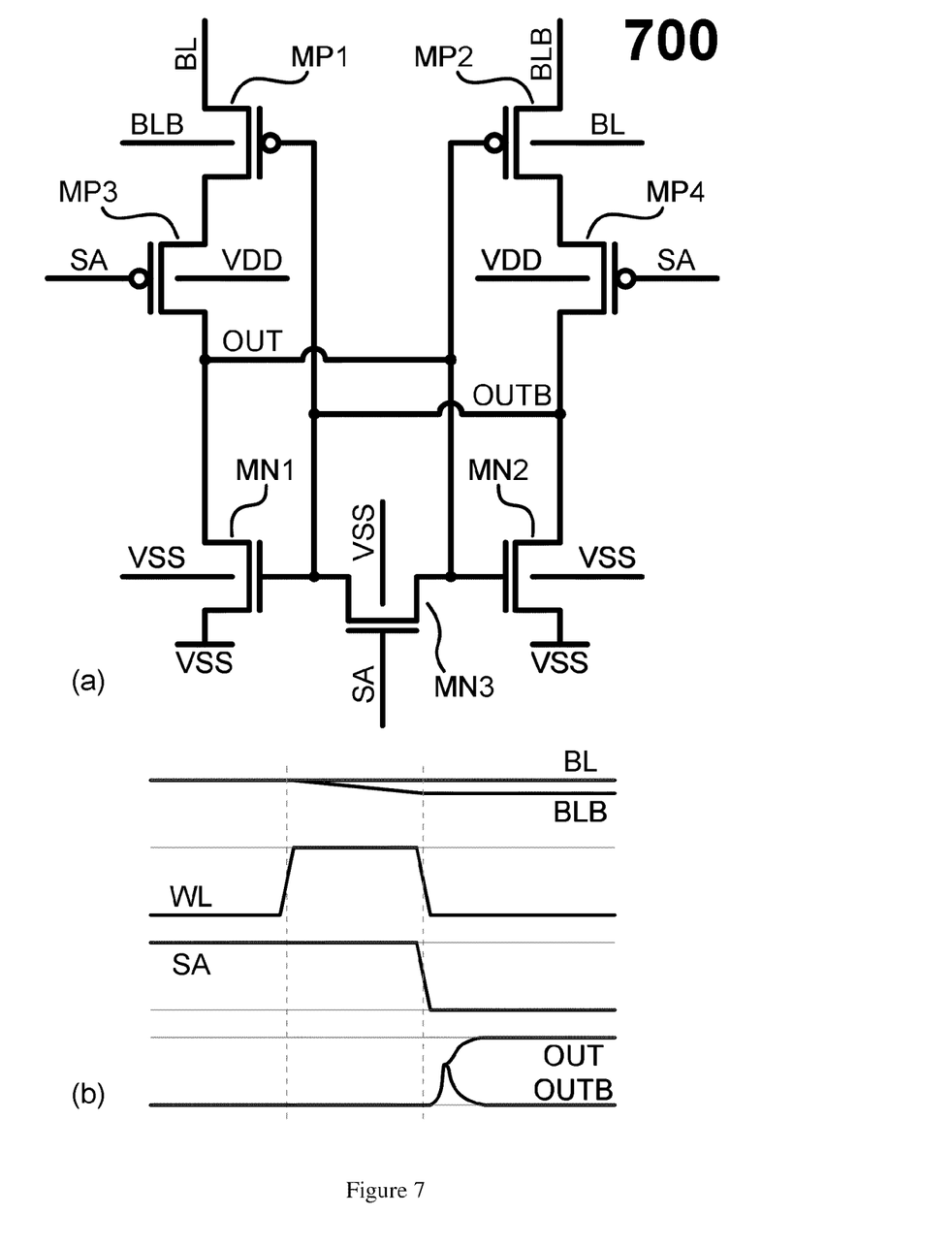
FIG. 7(a) is a circuit diagram of a sense amplifier according to an embodiment of the present invention
FIG. 7(b) is a diagram showing voltage waveforms which illustrate the operation of the sense amplifier shown in FIG. 7(a).

FIG. 7(a), a sense amplifier in accordance with an embodiment of the present invention is illustrated generally by the numeral 700. The sense amplifier 700 comprises a set of four p-channel transistors MP1, MP2, MP3, MP4, three n-channel transistors MN1, MN2, MN3, one control signal SA, two inputs BL, BLB, and two internal nodes OUT, OUTB. Transistors MP1 and MP2 are given the name PMOS feedback transistors. Transistors MP3 and MP4 are given the name gating transistors. Transistors MN1 and MN2 are given the name NMOS feedback transistors. Transistor MN3 is given the name equalization transistor.

Referring to

FIG. 7(a), the inputs BL and BLB represent a bit line pair which couples the sense amplifier to the SRAM array. In this embodiment the bit lines are assumed to be precharged to a high voltage potential. The internal nodes OUT and OUTS represent the complementary outputs of the sense amplifier.

Referring to

FIG. 7(a), the control signal SA represents the control signal which activates the operation of the sense amplifier. In this embodiment, when the signal SA is high the sense amplifier is inactive. In the inactive state the gating transistors MP3 and MP4 are off, disconnecting the drains of the feedback transistors. Also, in the inactive state the equalization transistor is on, ensuring that the internal nodes OUT and OUTB are the same. This has the effect of placing the sense amplifier in the metastable state.

Referring to

FIG. 7(b) the waveforms for various signals are illustrated. In this embodiment when the signal SA is low the sense amplifier is activated. When the sense amplifier is in the active state the equalization transistor is off, ensuring that the internal nodes OUT and OUTB are able to resolve to complementary values. In the active state the gating transistors MP3 and MP4 are on, connecting the drains of the feedback transistors, and therefore enabling the positive feedback operation of the latch which is comprised of the set of transistors MP1, MP2, MN1, MN2. At the instant the sense amplifier is activated the PMOS feedback transistors are on and the gating transistors are on. This means that a path exists between nodes OUT and OUTB and a high potential and therefore nodes OUT and OUTB begin to rise. However, there is an inequality between the degree that PMOS transistors MP1 and MP2 are on, due to the inputs BL and BLB not being equal. This inequality will result In a differential voltage between internal nodes OUT and OUTB which is amplifier by the positive feedback created by the feedback transistors. The positive feedback amplifies the differential voltage until the internal nodes OUT and OUTB resolve such that one is equal to the lower supply voltage and the other is approximately equal to the upper supply voltage.

For illustrative purposes, referring to

FIG. 7(b) the situation where BLB is lower than BL when the sense amplifier is activated is illustrated. In this case the transistor MP1 is more on than the transistor MP2. This results in more current flowing to node OUT than to node OUTB and hence the voltage on node OUT will rise faster than the voltage on node OUTB. This in turn results in transistor MN2 being more on than transistor MN1, which also helps the voltage on node OUT to rise faster than the voltage on node OUTB. In this manner the positive feedback intrinsic to the structure of the feedback transistors is affected so that eventually the transistor MP1 is on, transistor MP2 is off, transistor MN1 is off, transistor MN2 is on, the voltage on node OUT is high and the voltage on node OUTB is low. If the input BL was lower than BLB the opposite operation would take place, ending up with the voltage on node OUTB being high and the voltage on node OUT being low.

Once the output signals OUT and OUTB have resolved to high and low logical values no DC current will flow through the sense amplifier. The reason for this is that the path from either BL to VSS or BLB to VSS is blocked by an off transistor. In the case of the example the path from BL to VSS is blocked by the off transistor MN1 and the path from BLB to VDD is blocked by the off transistor MP2.

The sense amplifier 700 does not drive the bit lines BL and BLB, and hence neither BL nor BLB are discharged. This saves power, as in this embodiment the bit lines are normally pre-charged to the supply voltage VDD. The bit lines typically have a large intrinsic parasitic capacitance, and as such a relatively large amount of power is required to charge and discharge the bit lines. As the sense amplifier 700 does not discharge the bit lines, it also saves the power required to return them to a pre-charged state.

The sense amplifier 700 is not affected by the number of memory cells connected to a column. The intrinsic parasitic capacitance of the bit lines is largely dependent on the number of memory cells connected to the bit lines. Neither the delay nor the operation of sense amplifier 700 is altered by the magnitude of bitline capacitance.

Referring to

Figure 8:
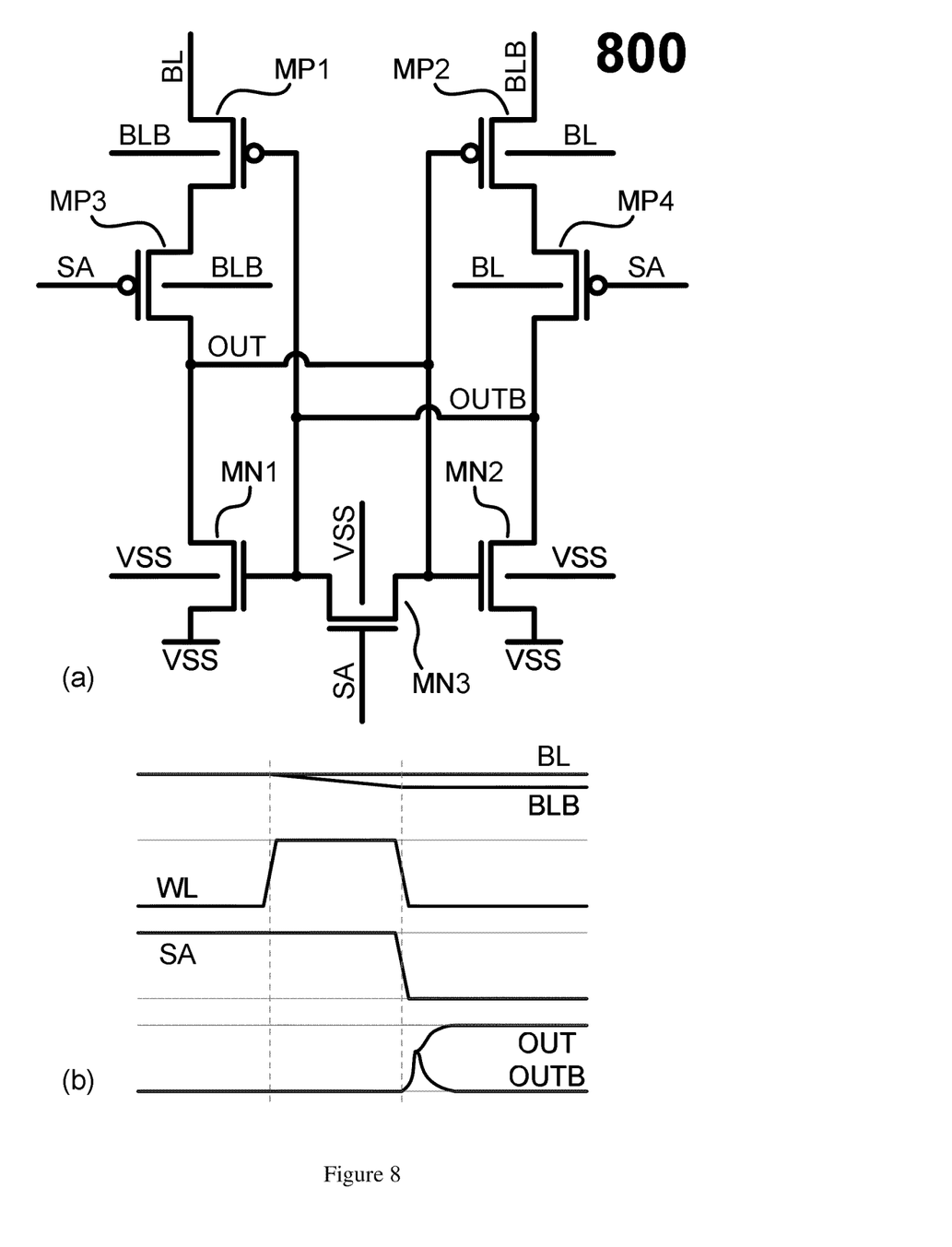
FIG. 8(a) is a circuit diagram of a sense amplifier according to another embodiment of the present invention
FIG. 8(b) is a diagram showing voltage waveforms which illustrate the operation of the sense amplifier shown in FIG. 8(a).

FIG. 8(a), a sense amplifier in accordance with an embodiment of the present invention is illustrated generally by the numeral 800. Referring to FIG. 8(b), a diagram showing voltage waveforms which illustrate the operation of the sense amplifier shown in FIG. 8(a). The sense amplifier 800 is similar to the sense amplifier 700, however the body connection of the PMOS feedback transistor MP1 is connected to the input signal BLB and the body connection of the PMOS feedback transistor MP2 is connected to the input signal BL. Moreover, the body connection of the PMOS gating transistor MP3 is connected to the input signal BLB and the body connection of the PMOS gating transistor MP4 is connected to the input signal BL. The operation of the sense amplifier 800 is similar to that of sense amplifier 700. One benefit of the embodiment 800 is that the body connections on the PMOS transistors allow faster operation compared with sense amplifier 700.

Referring to

Figure 9:
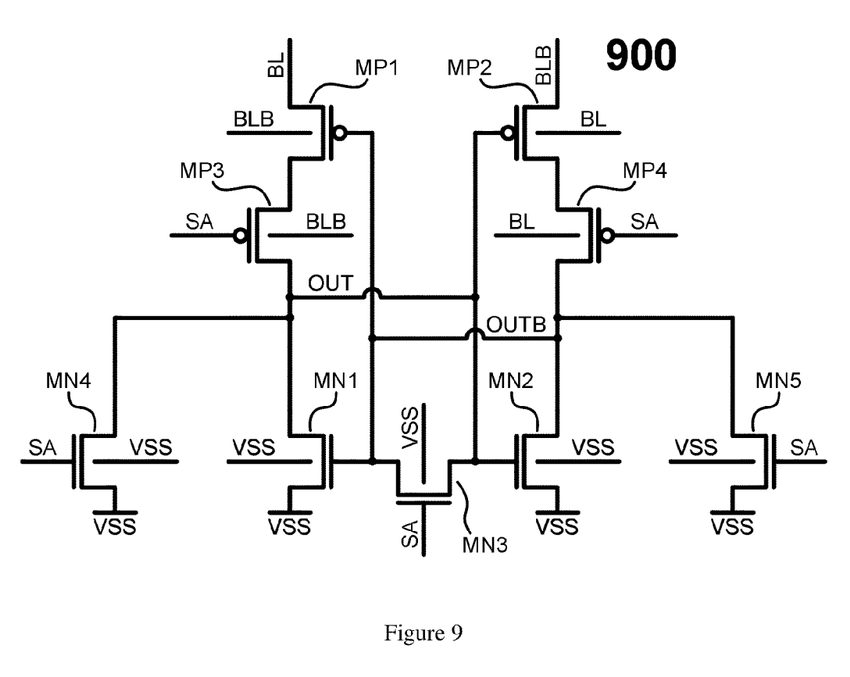
FIG. 9 is a circuit diagram of a sense amplifier according to another embodiment of the present invention

FIG. 9, a sense amplifier in accordance with an embodiment of the present invention is illustrated generally by the numeral 900. The sense amplifier 900 is similar to the sense amplifier 800 with the exception of the addition of the two transistors MN4 and MN5. These transistors act to fully discharge nodes OUT and OUTB to VSS when the sense amplifier is disabled. The transistors MN4 and MN5 can also be added to the embodiments 700. The benefit of the transistors MN4 and MN5 is that the nodes OUT and OUTS are fully discharged, which ensures that the magnitude of the voltage between the gate to source voltage of transistors MP1 and MP2 is as large as possible. This in turn ensures that these transistors have the lowest resistance possible at the time the sense amplifier is enabled. An additional benefit of embodiment 900 is that it provides a more consistent operation compared with other embodiments as its initial bias point is consistent.

Referring to

Figure 11:
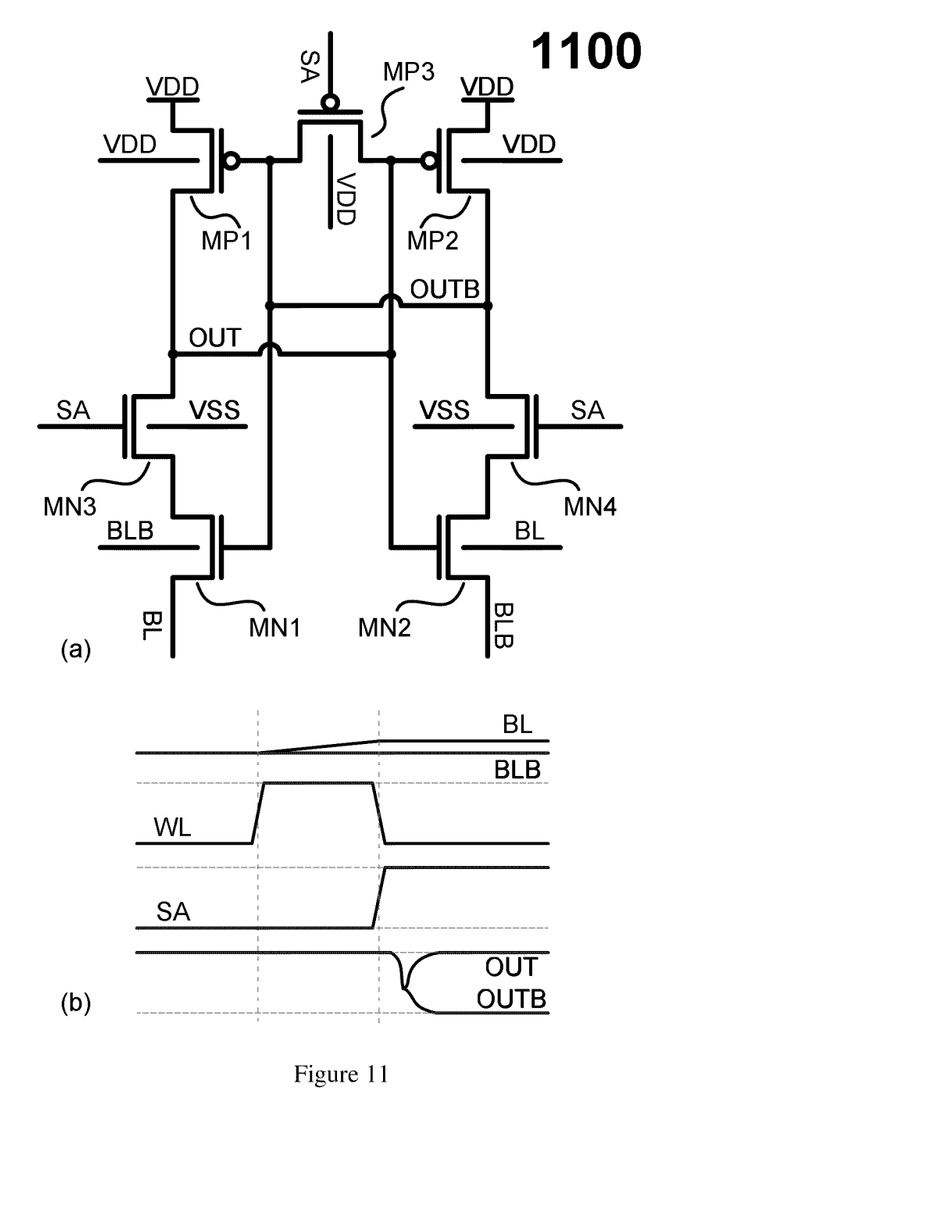
FIG. 11 is a circuit diagram of a sense amplifier according to another embodiment of the present invention

FIG. 11(a), a sense amplifier in accordance with an embodiment of the present invention is illustrated generally by the numeral 1100. This sense amplifier is the complementary structure to sense amplifier 700, with the NMOS transistors being changed to PMOS transistors, the PMOS transistors being changed to NMOS transistors and the polarities of all signals relating to the sense amplifier being reversed. Referring to FIG. 11(b), the input signals BL and BLB are now pre-charged low, whereas for sense amplifier 700 they were pre-charged high. The initial state of the internal nodes OUT and OUTB for sense amplifier 700 was low, however for sense amplifier 1100 the output nodes OUT and OUTB are initially high. In sense amplifier 700 the sense amplifier was active when the control signal SA was low, however in sense amplifier 1100 the sense amplifier is active when the control signal SA is high. The operation of the sense amplifier 1100 can easily be ascertained from section 0017 and 0018, and so the description thereof is omitted. The sense amplifier 1100 is useful for certain SRAM architectures where the bitlines are initially precharged to VSS, rather than VDD.

FIG. 11(a). In sense amplifier 1100 the NMOS feedback transistor MN1 is connected to the input signal BLB and the body connection of the NMOS feedback transistor MN2 is connected to the input signal BL.

Referring to

Figure 12:
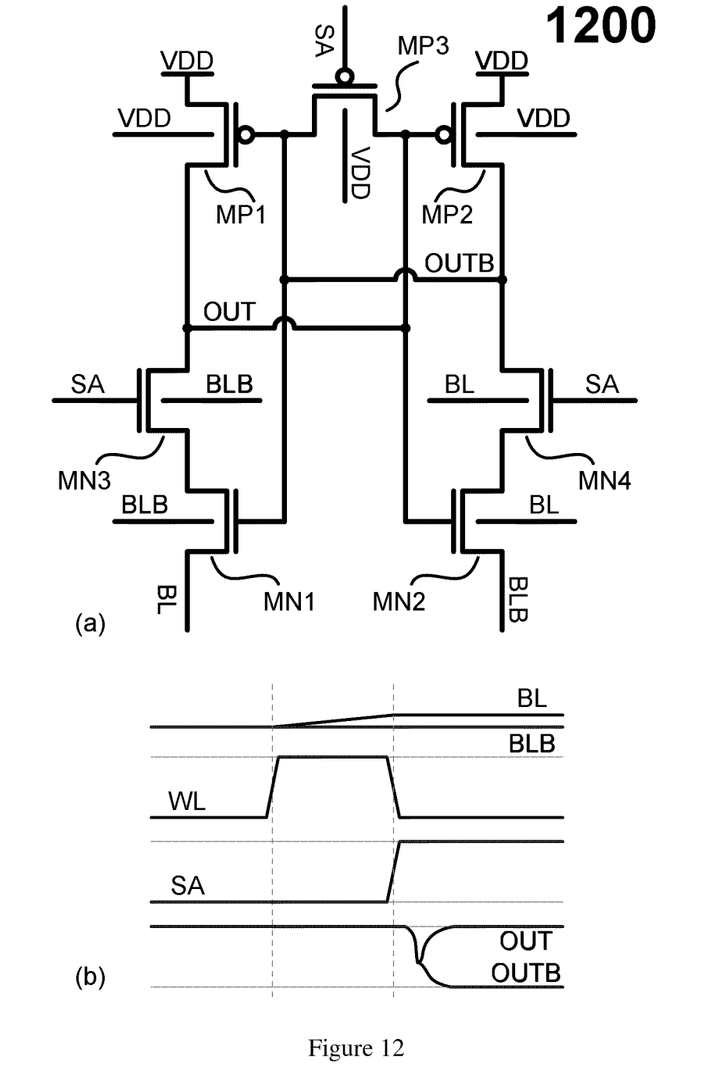
FIG. 12 is a circuit diagram of a sense amplifier according to another embodiment of the present invention

FIG. 12a, a sense amplifier in accordance with an embodiment of the present invention is illustrated generally by the numeral 1200. Referring to FIG. 8b, a diagram showing voltage waveforms which illustrate the operation of the sense amplifier shown in FIG. 12(a). The sense amplifier 1200 is similar to the sense amplifier 1000, however the body connection of the NMOS gating transistor MN3 is connected to the input signal BLB and the body connection of the NMOS gating transistor MN4 is connected to the input signal BL. The operation of the sense amplifier 1200 is similar to that of sense amplifier 1000. One benefit of the embodiment 1200 is that the body connections on the NMOS transistors allow faster operation compared with sense amplifier 1000.

Referring to

Figure 13:
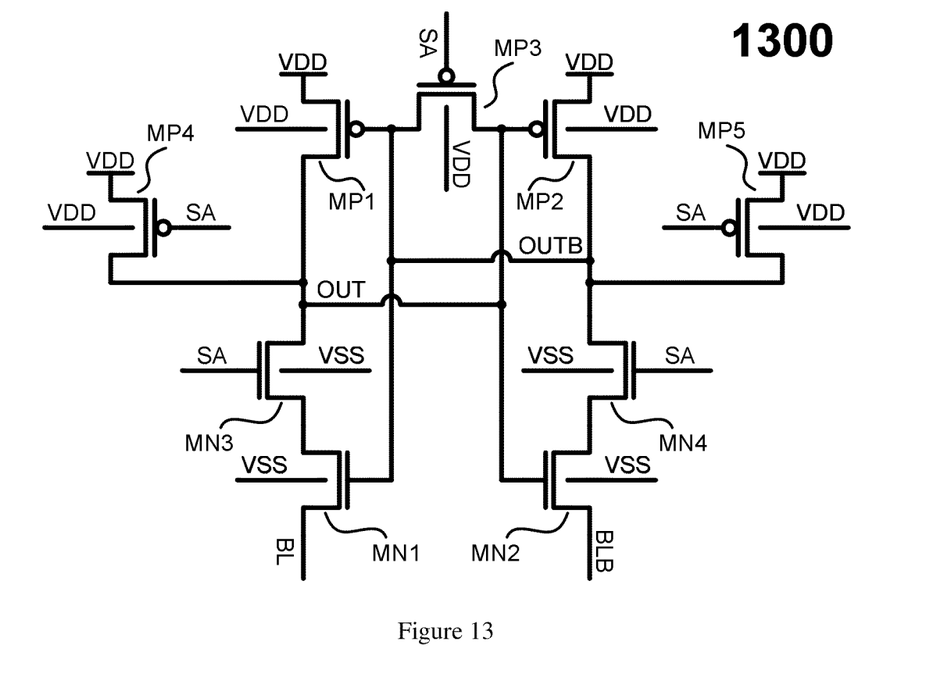
FIG. 13 is a circuit diagram of a sense amplifier according to another embodiment of the present invention

FIG. 13, a sense amplifier in accordance with an embodiment of the present invention is illustrated generally by the numeral 1300. The sense amplifier 1300 is similar to the sense amplifier 1100, however sense amplifier 1300 may comprise two additional transistors, MP4 and MP5. These transistors act to fully charge nodes OUT and OUTB to the supply voltage VDD when the sense amplifier is disabled. One benefit of embodiment 1300 is that it provides a more consistent operation compared with sense amplifier 1000 as its initial bias point is always the same.

All of the embodiments have been described as being comprised of a set of NMOS and PMOS transistors, which are planar MOSFETs. One can also utilize alternate embodiments of these sense-amplifier circuits in accordance with an embodiment of the present invention comprising a similar circuit architecture, however with N-type and P-type dual-gate, tri-gate or FinFET transistors instead of planar MOSFETs.

The advantages of the present invention include, without limitation, that it amplifiers a differential input signal quickly, it has a lower sensitivity to mismatch compared with other sense amplifiers and it dissipates only a small amount of energy.

Further, although preferred embodiments of the invention have been described herein, it will be understood by those skilled in the art that variations may be made thereto without departing from the spirit of the invention or the scope of the appended claims.

What is claimed is:

1. A sense amplifier comprising:
a first input signal line and a second input signal line for receiving a first input signal and a second input signal, respectively; and
a first internal node and a second internal node; and
a first output node and a second output node, said first output node and second output node configured to resolve to complementary levels when the sense amplifier is enabled; and
a control signal; and
a supply voltage; and
a first transistor of a first conductivity type, being referred to as the first type-1 feedback transistor, the source of said first type-1 feedback transistor being coupled to said first input signal line, the drain of said first type-1 feedback transistor being coupled to said first internal node and the gate of said first type-1 feedback transistor being coupled to said second output node; and
a second transistor of said first conductivity type, referred to as the second type-1 feedback transistor, the source of said second type-1 feedback transistor being coupled to said second input signal line, the drain of said second type-1 feedback transistor being coupled to said second internal node and the gate of said second type-1 feedback transistor being coupled to said first output node; and
a third transistor of said first conductivity type, referred to as the first type-1 gating transistor, the source of said first type-1 gating transistor being coupled to said first internal node, the drain of said first type-1 gating transistor being coupled to said first output node and the gate of said first type-1 gating transistor being coupled to said control signal; and
a fourth transistor of said first conductivity type, referred to as the second type-1 gating transistor, the source of said second type-1 gating transistor being coupled to said second internal node, the drain of said second type-1 gating transistor being coupled to said second output node and the gate of said second type-1 gating transistor being coupled to said control signal; and
a fifth transistor of a second conductivity type, referred to as the first type-2 feedback transistor, the source of said first type-2 feedback transistor being coupled to said supply voltage, the drain of said first type-2 feedback transistor being coupled to said first output node and the gate of said first type-2 feedback transistor being coupled to said second output node; and
a sixth transistor of said second conductivity type, referred to as the second type-2 feedback transistor, the source of said second type-2 feedback transistor being coupled to said supply voltage, the drain of said second type-2 feedback transistor being coupled to said second output node and the gate of said second type-2 feedback transistor being coupled to said first output node,
the body connection of said first type-1 feedback transistor being coupled to said second input signal line; and
the body connection of said second type-1 feedback transistor being coupled to said first input signal line.

2. A sense amplifier according to claim 1, wherein:
a seventh transistor of said second conductivity type, referred to as the first type-2 equalization transistor, the source of said first type-2 equalization transistor being coupled to said supply voltage, the drain of said first type-2 equalization transistor being coupled to said first output node and the gate of said first type-2 equalization transistor being coupled to said control signal; and
a eighth transistor of said second conductivity type, referred to as the second type-2 equalization transistor, the source of said first type-2 equalization transistor being coupled to said supply voltage, the drain of said first type-2 equalization transistor being coupled to said second output node and the gate of said first type-2 equalization transistor being coupled to said control signal.

3. A sense amplifier according to claim 2, wherein:
a ninth transistor of said second conductivity type, referred to as the third type-2 equalization transistor, the source of the third type-2 equalization transistor coupled to said first output node, the drain of the third type-2 equalization transistor Coupled to said second output node, the gate of the third type-2 equalization transistor coupled to said control signal.

4. A sense amplifier according to claim 2, wherein:
the body connection of said first type-1 gating transistor being coupled to said second input signal line; and
the body connection of said second type-1 gating transistor being coupled to said first input signal line.

5. A sense amplifier according to claim 3, wherein:
the body connection of said first type-1 gating transistor being coupled to said second input signal line; and
the body connection of said second type-1 gating transistor being coupled to said first input signal line.

6. A sense amplifier according to claim 1, wherein:
the body connection of said first type-1 gating transistor being coupled to said second input signal line; and
the body connection of said second type-1 gating transistor being coupled to said first input signal line.

* * * * *